United States Patent [19]
Hotaling

[11] Patent Number: 5,221,364
[45] Date of Patent: Jun. 22, 1993

[54] LIGHTWEIGHT SOLAR CELL

[75] Inventor: Steven P. Hotaling, Syracuse, N.Y.

[73] Assignee: The United States of America as represented by the Secretary of the Air Force, Washington, D.C.

[21] Appl. No.: 846,266

[22] Filed: Feb. 20, 1992

[51] Int. Cl.⁵ ........................ H01L 31/04; H01L 31/18
[52] U.S. Cl. .................... 136/249; 136/246; 136/256; 136/258; 136/259; 136/255; 437/2; 437/4; 427/74
[58] Field of Search .............. 427/74; 136/244–246, 136/249 TJ, 252, 255, 256, 258 AM, 258 PC, 259–265; 437/2–5

[56] References Cited

U.S. PATENT DOCUMENTS

| | | | |
|---|---|---|---|
| Re. 32,107 | 4/1986 | January | 501/12 |
| 4,028,085 | 6/1977 | Thomas | 65/134 |
| 4,101,101 | 7/1978 | Barkats et al. | 244/173 |
| 4,384,163 | 5/1983 | Rauschenbach et al. | 136/245 |
| 4,394,529 | 7/1983 | Gounder | 136/245 |
| 4,401,710 | 8/1983 | Bansemir et al. | 428/229 |
| 4,554,038 | 11/1985 | Allard | 156/196 |
| 4,681,615 | 7/1987 | Toki et al. | 65/18.1 |
| 4,686,322 | 8/1987 | Kujas | 136/245 |
| 4,717,773 | 1/1988 | Kenney et al. | 556/457 |
| 4,816,324 | 3/1989 | Berman | 428/216 |
| 4,968,372 | 11/1990 | Maass | 156/249 |

*Primary Examiner*—Aaron Weisstuch
*Attorney, Agent, or Firm*—Thomas C. Stover; Donald J. Singer

[57] ABSTRACT

A method for fabricating a lightweight solar cell is provided wherein a) an LD silica aerogel substrate at densities between 10–1,000 mg/cc is prepared, b) the surface of such aerogel substrate is polished to an optical quality surface c) a dielectric planarization layer of $SiO_2$ is applied to so-polished substrate surface and d) one or more photovoltaic thin film layers are deposited on the planarization layer to form such lightweight solar cell, which includes an LD aerogel substrate that was not available before the invention hereof. Such substrates as well as the PV thin film layers are sufficiently transparent to admit energizing light not only through the PV layers of the cell but also if desired, through the substrate side of such cell, to energize such PV layers from one or both sides as desired. The solar cells of the invention, with their LD aerogel substrates are much lighter than prior art solar cells. This is advantageous in satellite applications since the solar array weight is substantial. Such lightweight solar cells of the invention also find further advantage on the ground, e.g. for solar-powered vehicles in which weight is a primary concern.

16 Claims, 4 Drawing Sheets

LIGHTWEIGHT SOLAR CELL

STATEMENT OF GOVERNMENT INTEREST

The invention described herein may be manufactured and used by or for the Government for governmental purposes without the payment of any royalty thereon.

BACKGROUND OF THE INVENTION

1. FIELD OF THE INVENTION

This invention relates to a lightweight solar cell, particularly a cell having a substrate of low density.

2. THE PRIOR ART

The current state of the art in solar cell design is to deposit a photoconductive material onto a substrate, e.g. of glass or a low expansion glass ceramic. These substrate materials have densities of approximately 2.2 gms/cc (2200 mg/cc) or higher. Accordingly, the weight of an array or battery of such prior art solar cells is a determining factor in the size of the battery system to be launched into space due to payload weight constraints. However, if a lighter weight cell substrate could be fabricated, the resulting savings in size for weight would translate into an increased allowable size for satellite photovoltaic energy systems, which implies higher reliability and accessibility of the satellite throughout its life cycle.

There has now been discovered a method of manufacture of lightweight solar cells having a substrate density considerably below, eg. 2200 mg/cc of the above prior art glass substrates. In fact, the present invention provides cell substrates of greatly reduced densities, e.g. in the range of 30–1,000 mg/cc, to provide a significant decrease in solar cell array weight.

The present invention employs a solar cell substrate of low density or LD. By low density or LD substrate, as used herein, is meant one with a density of from 10–1,000 mg/cc.

SUMMARY OF THE INVENTION

Broadly, the present invention provides a lightweight solar cell comprising an LD aerogel substrate having one or more layers of photoconductive material deposited thereon.

Such aerogel substrates can have a density of from 10–1,000 mg/cc and preferably from 30–450 mg/cc. Further, the layers of photoconductive material deposited on such substrate, are preferably transparent through a plurality of layers deposited on such substrate.

The invention further provides a method for fabricating a lightweight solar cell from LD aerogels comprising, preparing an LD aerogel substrate at densities between 10–1,000 mg/cc, polishing and planarizing said substrate and depositing one or more photovoltaic layers on such substrate to provide a lightweight solar cell.

Figure 1:
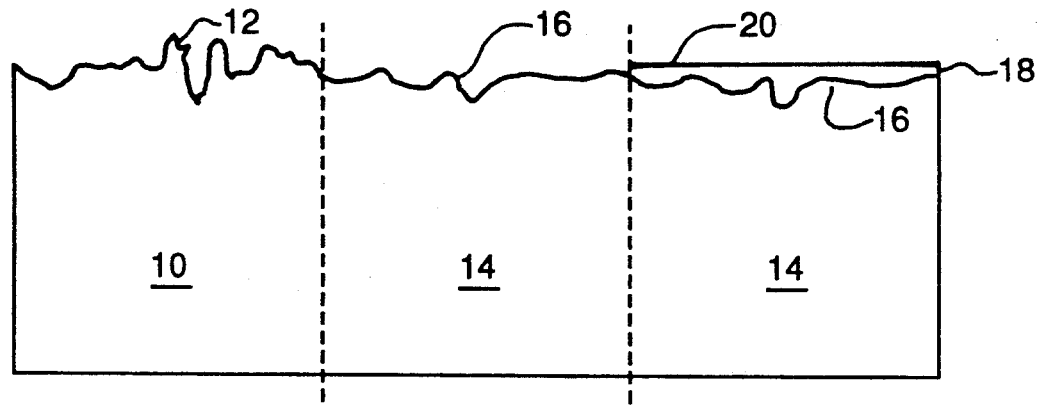
FIG. 1 is a sectional elevation schematic view of components of the lightweight solar cell embodying the present invention.

DESCRIPTION OF PREFERRED EMBODIMENTS:

The lightweight solar cell 10 the invention includes a substrate 12 of aerogel, e.g. silica aerogel surmounted by certain layers as discussed below. The method of preparing such aerogel has recently been carried out by others and by itself does not define the novelty of the present invention.

The preparation of such aerogel includes the hydrolysis and condensation of tetraethoxysilane (TEOS) and/or tetramethoxysilane (TMOS) to produce gels which are then supercritically extracted to a low-density silicon glass network. This single-step solgel process has been used for several years in producing materials with densities ranging from 20 to 1100 mg/cc. This method is suitable for preparing LD aerogels employed in the present invention. However, such method requires high temperatures, eg. 400 °C. and pressures, eg. 300 bars and certain precautions may be required.

The present invention employs an aerogel preferably made by a two-step extraction process. The two-step process differs from a conventional solgel process in that it generally proceeds at lower temperatures and pressures than the above one-step process and instead of requiring an extremely dilute solution to gel as in the single-step reaction, a partially hydrolyzed, partially condensed polysilicate mixture is prepared from which the alcohol is replaced as the solvent and then this non-alcoholic solvent is supercritically extracted.

That is, the solvent replacement technique employs liquid carbon dioxide, $CO_2$, to purge the system of the alcohols and then supercritically extracts the replacement solvent, ie. heats the system to a relatively low 40° C., (and eg. 40 bars pressure) to drive off the $CO_2$. This leaves a very low density silicon dioxide network or aerogel, with densities ranging from 3 to 900 mg/cc.

In a more specific example, aerogel mirror substrates of the invention are fabricated using the above technology by first preparing a condensed silica oil by reacting TMOS with a sub-stoichiometric amount of water in methanol, under acidic conditions, with the following molar ratios:

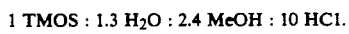

1 TMOS : 1.3 $H_2O$ : 2.4 MeOH : 10 HCl.

This mixture is then distilled, removing much of the methanol and leaving the silica oil (which includes the TMOS). The oil is then hydrolyzed:

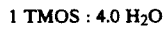

1 TMOS : 4.0 $H_2O$

This reaction is done in a Pyrex glass mold in the presence of a non-alcoholic basic diluent ($NH_4OH$). Gel times vary from 12–72 hours. The silica aerogel is obtained from this "alcogel" by using liquid carbon dioxide to purge the alcogel of alcohol and replace it with such liquid carbon dioxide (which keeps the aerogel pores open). Thereafter heat is applied to raise the temperature of such aerogel to about 40° C., to apply supercritical triple point extraction ($CO_2$ phase diagram) to drive off such replacement solvent in the autoclave. The temperature is ramped (up to about 40° C.) while pressure is controlled and when finished, the autoclave (and the dried porous aerogel) is purged with dry nitrogen. The aerogel mirror substrate is then removed from the mold for polishing, coating and testing per the invention. For more information on the above two-step extraction process or solvent replacement technique, in preparing aerogels, see an article by Laurence Hrubish and Thomas Tillotson in a book entitled "Better Ceramics through Chemistry-Part IV," *Materials Research Society*, MRS Press, Pittsburgh, PA, 1991, which article is incorporated herein by reference.

Thus, to summarize, the aerogel starts as a sol, a colloidal suspension of solid particles in a liquid solvent. A catalyst is introduced to expedite gelation and after some aging time, the liquid is extracted from the gel. The liquid solvent is extracted in a two-step or solvent replacement method in which the solvent is replaced in the gel by a liquid having a lower critical temperature, e.g. liquid $CO_2$, followed by supercritical extraction of the $CO_2$ in a critical point, drying unit such as an autoclave.

The aerogel precursor 10, as indicated in FIG. 1, has high porosity, densities as low as 10 mg/cc, and less than 1% solids content. The rough surface 12 (per FIG. 1 and FIG. 3 at section A) of such precursor is not yet suitable as an optical substrate. However, such aerogel substrate precursor is improved, according to the invention, by polishing the surface thereof, eg. by a lapping process. The technique for polishing such precursor, however, is different from that of polishing a glass sample. Liquids employed in polishing glass samples would dissolve the aerogel material. Accordingly, instead of water, a Freon (dichlorodifloromethylene) spray is used during the lapping process. A minimum of such spray is employed and it is applied directly onto the lapping paper rather than onto the aerogel surface to minimize an over-wetting effect (which can dissolve the aerogel material).

The lapping is performed on a diamond or sapphire lapping film with rms roughness ranging from 64 to 1 microns. These lapping films are generally used for polishing fiberoptical cables after cleaving and are commercially available.

Having obtained the polished aeroge substrate, it is then planarized with $SiO_2$ using PECVD (Plasma Enhanced Chemical Vapor Deposition) and thermal evaporation techniques. The PECVD is performed, eg. in a Technics Series 900 RF reactor using a silane/nitrous oxide plasma. In one example, the substrate temperature was 240° C. and RF power was 34 watts. The film deposition rate was determined by ellipsometry (on co-deposited Silicon wafers) to be 506 Angstroms/minute. In this example an Edwards evaporator was employed to deposit the $SiO_2$ planarization layer at an initial chamber pressure of $8 \times 10^{-7}$ mbar. The substrate temperature was 50°-110° C. (as measured by a thermocouple within 1 cm of the substrate). When using both the PECVD and evaporation deposition chambers, the substrate was outgassed under high vacuum for more than 30 minutes. The evaporant was outgassed at a current of 15 amps for over 2 minutes prior to deposition, which was performed at a current of 23 amps when using the evaporator for dielectric thin film evaporation.

Figure 2:
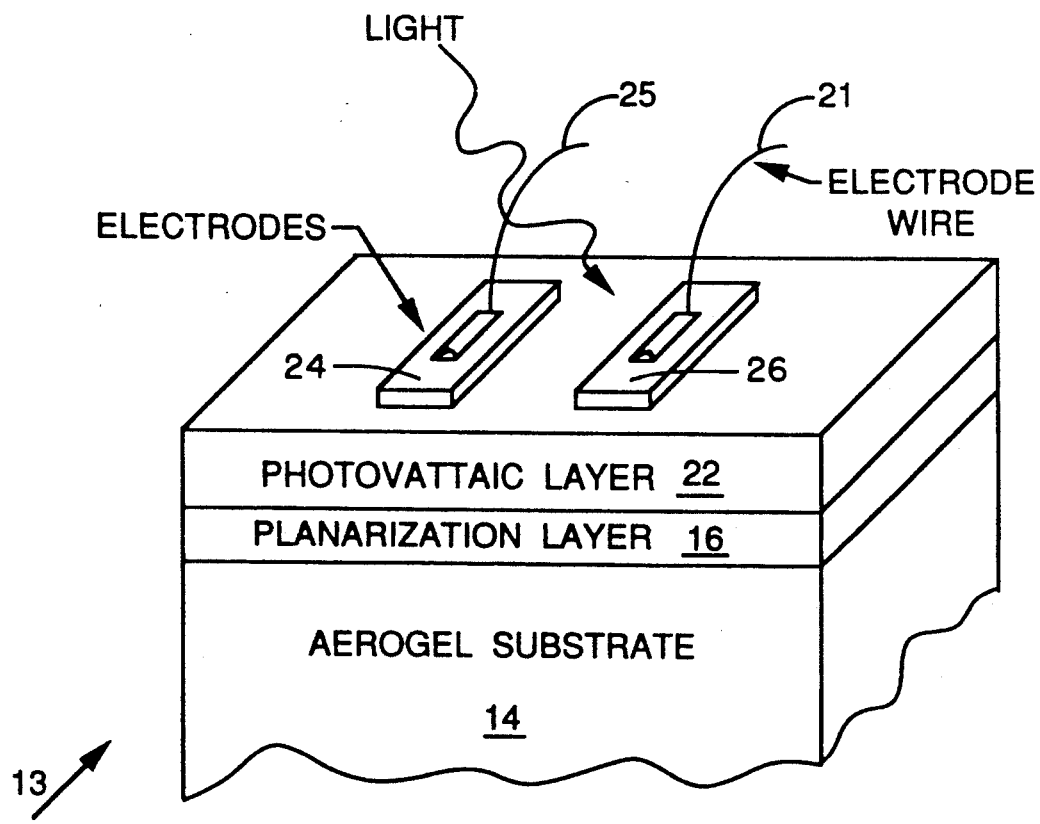
FIG. 2 is a perspective view of the lightweight solar cell embodying the present invention.
Figure 3:
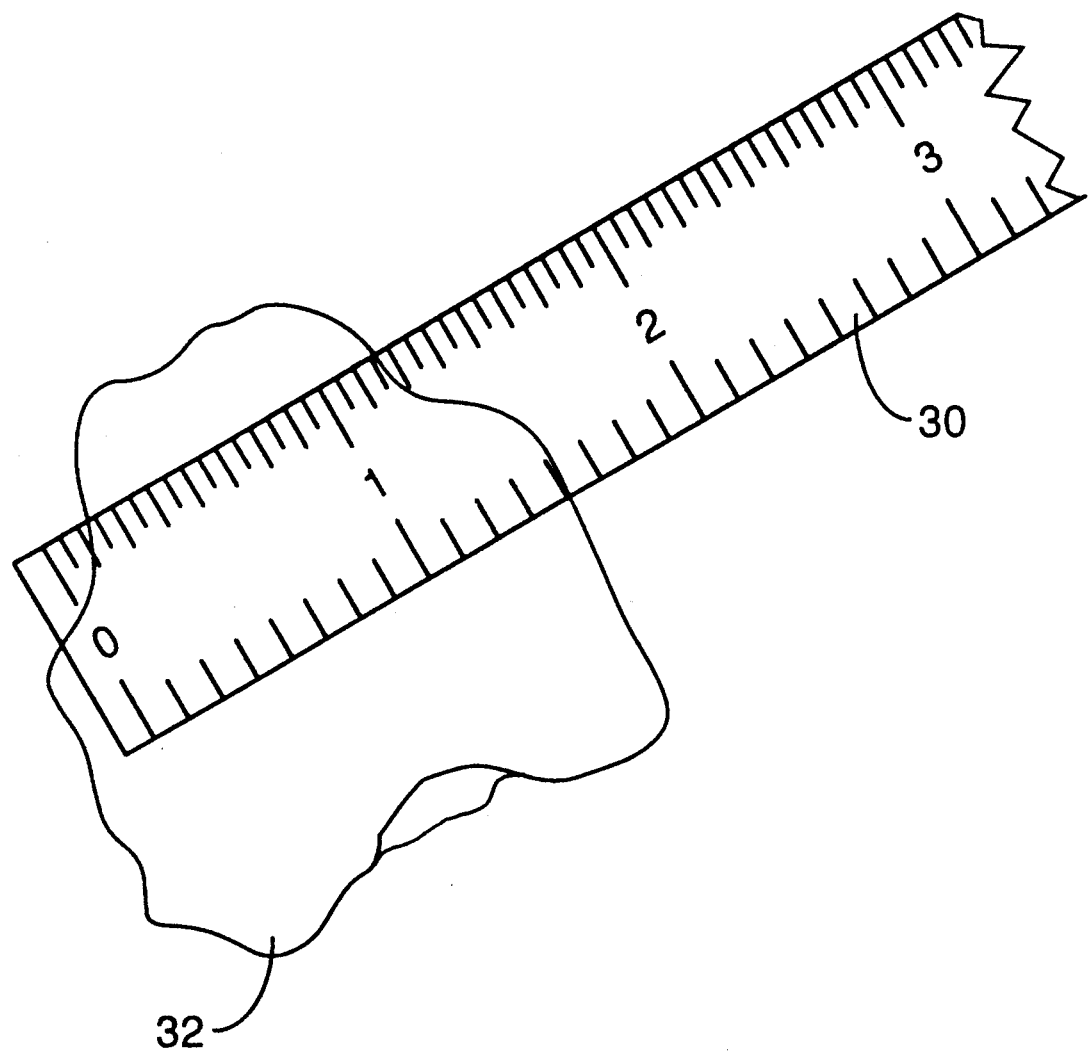
FIG. 3 is an elevation view of substrate material of the lightweight solar cell embodying the present invention.

Thus, per the example above, the polished aerogel substrate 20 of FIG. 2, having polished surface 22, is coated with a planarization layer 32 to provide a planarized substrate 30, as shown in FIG. 3 at section C.

The planarized substrate 30 is then coated with a reflective coating per the method of the invention as follows. In one example, planarized aerogel dielectric samples (PECVD or evaporated $SiO_2$ on polished aerogel substrate) were placed into an Edwards evaporator and aluminum and yttrium oxide MLD (Multi Layer Dielectric) $Al/Y_2O_3$ thin films were applied by deposition. The deposition conditions for the aluminum were: $2 \times 10^{-6}$ mbar, metal outgas at 10 amps with the shutter closed for one minute and depositing at a current of 15 amps for various times (1-3 minutes). The shutter was not opened until the deposition current was stabilized. Substrate temperature was, e.g. 30° C.

Thus, per the example above, the substrate 10 having rough surface 12, is polished to provide an aerogel substrate 14 having a less rough surface 16, which is then coated with a planarization layer 18, having a smooth upper surface 20, as shown in FIG. 1.

As shown in FIG. 2, the aerogel substrate 14 with its planarization layer 16 has photovoltaic layer 22 coated thereon, which layer 22 is surmounted in turn by electrodes 24 and 26, having lead wires 25 and 27 respectively, to provide a lightweight solar cell 13 embodying the present invention.

Two important features of the lightweight solar cell of the invention are a) the LD aerogel substrate which assists the fabrication of lightweight solar cells according to the invention and b) the transparency of such substrate and the respective layers coated (including deposited) thereon.

That is, the aerogel substrate layer per the invention, can be significantly transparent as illustrated in FIG. 3, where ruler 30 is plainly visible behind a sample of 40 mg/cc density aerogel substrate.

The photovoltaic or "PV" layers of the solar cell of the invention are also desirably significantly transparent although some light absorption is needed to provide the photovoltaic effect in such layers.

Figure 4:
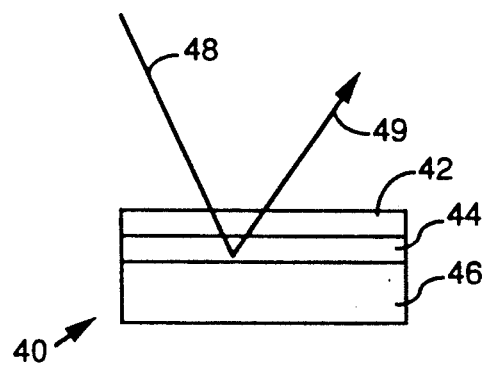
FIGS. 4, 5, and 6 are schematic elevation views of three lightweight solar cells according to the present invention
Figure 5:
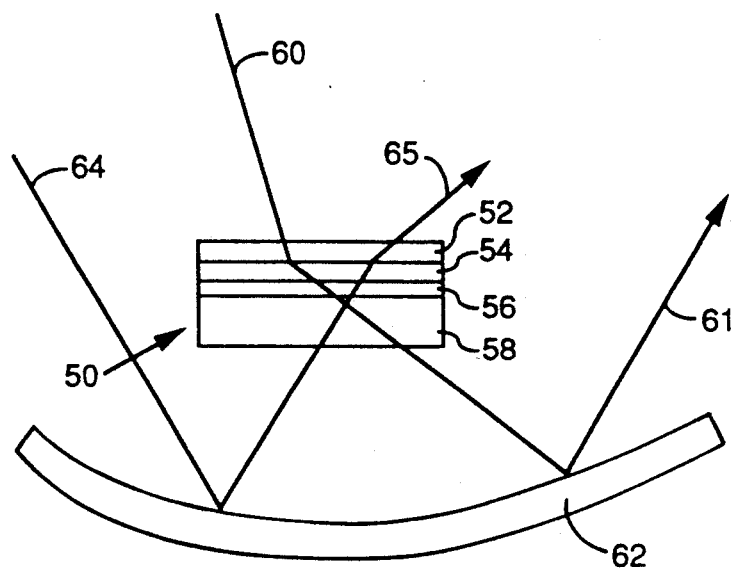
Figure 6:
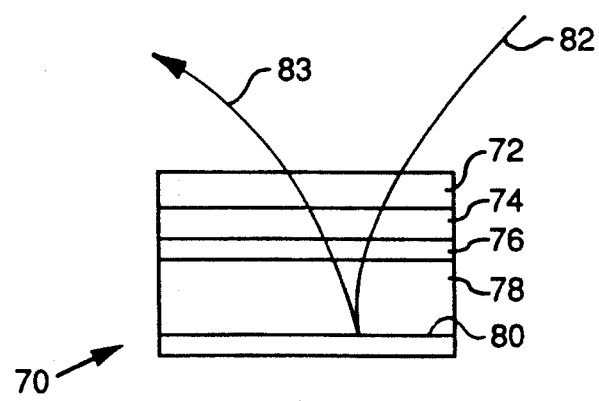

By having a transparent substrate under one or more PV layers, the solar cell of the invention can be activated or energized from either side. By having the PV layers significantly transparent, one can mount a plurality of such PV layers atop one another on such substrate and have such layers activated by light from above such layers or from below the substrate. Examples of solar cell variations according to the invention, are shown in FIGS. 4, 5, and 6. Thus, where lightweight solar cell of the invention 40 has PV layer 42 atop planarization layer 44, atop aerogel substrate 46, the latter being opaque to light transmission, incoming light beam 48 is reflected off such substrate per arrow 49, as shown in FIG. 4.

In the case of lightweight solar cell of the invention 50 having PV layer 52 surmounted on PV layer 54, mounted atop planarization layer 56, in turn coated on aerogel substrate 58, all of such layers being transparent in varying degrees, light beams can pass through such solar cell from the back or front sides thereof as shown in FIG. 5. Thus light beam 60 passes through the solar cell layers from above the PV side thereof and is subsequently diverted to path 61 by reflector 62 as shown in FIG. 5. Concurrently or at another time, incoming light beam 64 is reflected by reflector 62, through the substrate 58, up through the respective cell layers 56, 54 and 52, to energize the latter two PV layers behind, as indicated by arrow 65 as shown in FIG. 5.

In another example, lightweight solar cell embodying the invention 70 has PV layer 72 atop PV layer 74, atop planarization layer 76, atop aerogel substrate 78, atop and mounted to reflector 80, all such layers except reflector 80, being transparent as shown or indicated in FIG. 6. Incoming light beam 82 passes through the respective layers, energizing the PV layers 72 and 74 and continuing through the transparent substrate to be reflected off the reflector layer 80, to return through the respective layers of the solar cell and emerge as arrow 83 as shown in FIG. 6.

Thus the lightweight solar cell of the invention by employing combinations of transparent, opaque and/or reflective layers, can provide numerous solar cell embodiments or variations within the scope of the present invention.

This transparency of the above respective layers of the solar cell of the invention can be useful in multi-layer structures in which both the visible and IR wavelengths would be used for photocurrent generation. The relatively high transparency would also lend itself to a multispectral application as a semiconductor or doped aerogel monolithic solar cell.

Figure 7:
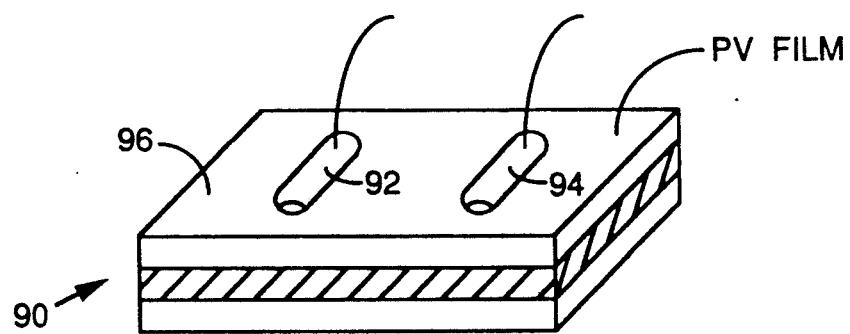
FIGS. 7, 8, and 9 are perspective views of additional lightweight solar cells embodying the present invention.
Figure 8:
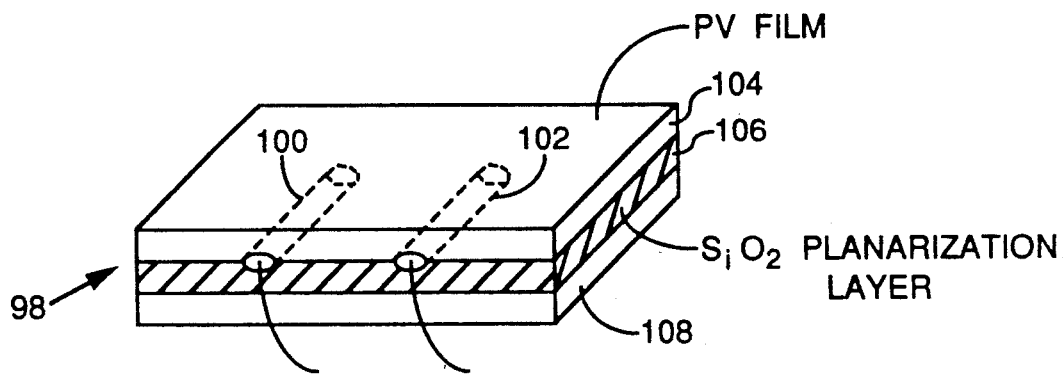
Figure 9:
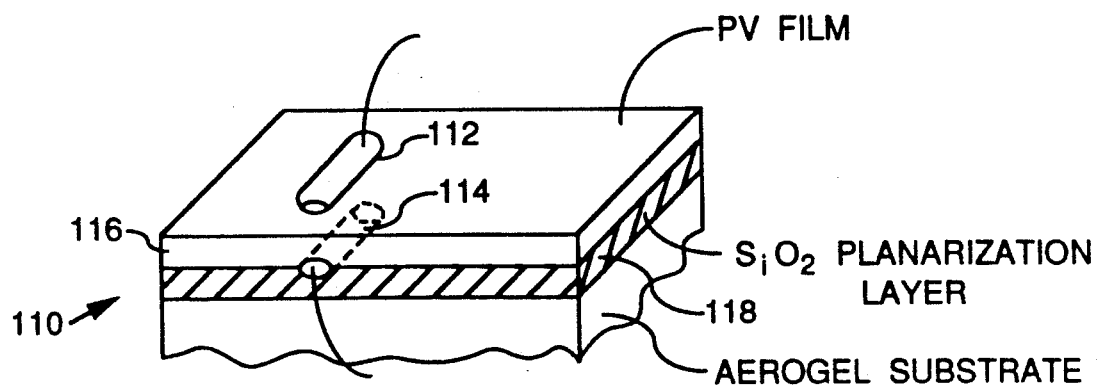

Various arrangements of electrodes or contacts are possible in the lightweight solar cell embodying the present invention, as indicated in FIGS. 7, 8, and 9. Thus solar cell 90 has a pair of contacts 92 and 94, mounted atop the PV layer 96 in a "top coplanar" arrangement as shown in FIG. 7.

In another embodiment of the invention, solar cell 98 has contacts 100 and 102 mounted between the PV layer 104 and the planarization layer 106 (mounted in turn on the aerogel substrate 108) in a "bottom coplanar" arrangement as shown in FIG. 8.

In a further embodiment of the invention, solar cell 110 has one contact 112 mounted atop and one contact 114 mounted below, the PV layer 116, just above the planarization layer 118, in a "top and bottom" arrangement as shown in FIG. 9.

As additional PV layers are added atop the base PV layer, it can be seen that such contacts can be spaced apart vertically, horizontally, or a combination thereof, in various combinations depending upon the number of PV layers employed as well as various coplanar arrangements, within the scope of the invention.

The substrate of the solar cells embodying the invention can be made from inorganic aerogels of, e.g. $SiO_2$, $SiO_3$, $SiC$, $KCl$, and $Be_2O_3$. Such substrate can also be made of LD organic aerogels (in the presence of a catalyst) to obtain aerogels of resorcinol-formaldehyde and melamine-formaldehyde.

The aerogel employed herein can have a density of from 10–1,000 mg/cc. However, for solar cell applications it is preferred to employ aerogel substrates having densities between 40–800 mg/cc.

As noted previously, a dielectric planarization layer is applied to the polished aerogel substrate by various methods including a) Plasma-Enhanced Chemical Vapor Deposition (PECVD), b) Thermal Evaporation, c) Sputtering, d) Spin Coating (or Spray Spinning), and e) other suitable film deposition techniques.

The planarization layer can be of a dielectric such as $SiO_2$, $SiC$, and $Y_2O_3$.

For example, a planarization layer of $SiO_2$ was deposited by methods a) and b) above on polished substrate samples of silica aerogel.

The PV layers are desirably thin films of hydrogenated amorphous silicon, a-Si:H. Such PV thin films can also be, eg. Si/Ge alloys, $CuInSe_2$, $AlGaAs$, $CdZnTe$, $CuGaSe_2$, and $CdMnTe$, as well as $CdS$, $CdMn$, $CdTe$, and $CdInSe_2$. The above electrodes or contacts employed in the solar cells embodying the invention, can be various conductors such as metal rods, pins or foil, including painted-on metal, eg. painted silver strips mounted in contact with the PV layers, including PV thin films or various other electrodes suitable for contact with such PV layers within the scope of the present invention/

Also, metallic electrodes can be deposited onto the PV layers using vacuum thermal deposition. Electrode or contact materials include aluminum, gold, titanium, chromium, silver, and other electric conductors.

The following example is given to illustrate the present invention and should not be construed in limitation thereof.

EXAMPLE I

A lightweight solar cell according to the present invention, was fabricated using PECVD in which a photovoltaic thin film of a-Si:H was deposited on a planarization layer of $SiO_2$ atop a silica aerogel substrate. Such substrate had a density of 40 mg/cc and was baked at 250°C. for 20 minutes prior to the PECVD process. The a-Si:H was derived from plasma-assisted decomposition of a silane ($SiH_4$) and argon (Ar) gas mixture with a 20% Ar : 25% $SiH_4$ mass flow ratio at a reactor pressure of 0.554 torr.

Such solar cell was found to be light in weight, with strong voltage characteristics and good transparency on both sides of the planarization layer.

Thus, lightweight solar cells prepared according to the present invention have the advantage of being much lighter for thin film substrate applications than the more commonly used glasses. This translates to an advantage for satellite applications since the solar array weight is substantial. The solar cells embodying the invention can also be used for terrestrial applications notably for solar powered street lamps and solar powered vehicles in which weight is to primary concern.

What is claimed is:

1. A method for fabricating a lightweight solar cell from aerogels, comprising:
   a) preparing an LD aerogel substrate at densities between 10–1,000 mg/cc,
   b) polishing the surface of said aerogel substrate,
   c) applying a dielectric planarization layer to the so-polished aerogel surface and
   d) depositing at least one PV layer on said planarization layer to provide a lightweight solar cell.

2. The method of claim 1 wherein a plurality of PV layers are deposited on said planarization layer.

3. The method of claim 7 wherein said PV layers are PV thin films.

4. The method of claim 1 wherein said PV layer is a thin film.

5. The method of claim 1 wherein said substrate has a density of from 40–800 mg/cc.

6. The method of claim 1 employing an organic or inorganic aerogel substrate.

7. The method of claim 1 wherein at least a pair of metal electrodes are deposited on or mounted in contact with said at least one PV layer.

8. A lightweight solar cell comprising:
   a) an LD aerogel substrate having a density of between 10–1,000 mg/cc, the surface of said substrate being polished b) a dielectric planarization layer being applied to the polished surface, and c) at least one layer of PV material deposited thereon.

9. The solar cell of claim 8 having a plurality of PV layers deposited on said planarization layer.

10. The solar cell of claim 9 wherein said PV layers are PV thin films.

11. The solar cell of claim 10 wherein said PV thin films are those selected from the group consisting of CdS, CdTe, CdInSe$_2$, CdZnTe, CdMnTe, CuInSe$_2$, AlGaAs, and Si/Ge alloys.

12. The solar cell of claim 8 wherein at least one of the PV layer, the planarization layer, and the aerogel substrate is substantially transparent.

13. The solar cell of claim 12 wherein the aerogel substrate has a density of 30–800 mg/cc.

14. The solar cell of claim 13 having electrodes in contact with one or more PV layers at coplanar or different levels thereof.

15. The solar cell of claim 14 wherein said electrodes are selected from the group consisting of metal rods, pins, bars, sheet, foil, and coatings.

16. The solar cell of claim 15 wherein all the layers thereof including the substrate are substantially transparent and admit light from the PV layer side and the substrate side thereof to energize such solar cell.

* * * * *